United States Patent
Kemmochi et al.

[11] Patent Number: 6,136,624
[45] Date of Patent: Oct. 24, 2000

[54] ARRAY SUBSTRATE, LIQUID CRYSTAL DISPLAY DEVICE AND THEIR MANUFACTURING METHOD

[75] Inventors: Masato Kemmochi; Masato Shoji, both of Fukaya, Japan

[73] Assignee: Kabushiki Kaisha Toshiba, Kawasaki, Japan

[21] Appl. No.: 09/038,501

[22] Filed: Mar. 9, 1998

[30] Foreign Application Priority Data

Mar. 7, 1997 [JP] Japan ................................. 9-053375

[51] Int. Cl.[7] .................................................. H01L 21/00
[52] U.S. Cl. .......................... 438/30; 438/40; 438/149; 438/150; 438/151; 438/152; 438/597; 438/618; 438/622; 438/623; 438/624; 438/637; 438/638; 438/640; 438/666; 438/673
[58] Field of Search ................................ 438/30, 40, 149, 438/150, 151, 152, 597, 618, 622, 623, 624, 637, 638, 640, 666, 673

[56] References Cited

U.S. PATENT DOCUMENTS

| | | | |
|---|---|---|---|
| 5,895,937 | 4/1999 | Su et al. ........................ | 257/59 |
| 5,917,571 | 6/1999 | Shimada ........................ | 349/138 |
| 5,926,235 | 6/1999 | Han et al. ...................... | 349/43 |

FOREIGN PATENT DOCUMENTS 07020496  1/1995  Japan.

*Primary Examiner*—John F. Niebling
*Assistant Examiner*—Viktor Simkovic
*Attorney, Agent, or Firm*—Pillsbury Madison & Sutro LLP

[57] ABSTRACT

An array substrate typically used in a liquid crystal display device includes inter-layer insulating films thick enough to prevent step-off breakage of conductive layers at contact holes while promising a reliability. Thick inter-layer insulating films are made by stacking a film made of an inorganic material, such as silicon nitride or silicon oxide, having a low moisture permeability and thereby promising a reliability of the liquid crystal display device, and a film made of an organic material, such as acrylic resin, that can be readily stacked thick so that the inner wall of the contact hole is gently sloped with respect to the substrate surface to thereby prevent step-off breakage of a conductive layer as thin as 100 nm or less.

18 Claims, 12 Drawing Sheets

ARRAY SUBSTRATE, LIQUID CRYSTAL DISPLAY DEVICE AND THEIR MANUFACTURING METHOD

BACKGROUND OF THE INVENTION

This invention relates to an array substrate, liquid crystal display device and their manufacturing method. More specifically, the invention relates to an array substrate having an inter-layer insulating film thick enough to suppress cross talk or coupling capacitance between wiring lines, preventing step-off breakage of electrodes at contact holes, and having a sufficient reliability; a liquid crystal device using the array substrate; and their manufacturing method.

The demand for high integration has progressively become strong regarding liquid crystal display devices such as an active matrix type display device. That is, it is required to make a number of various electronic elements and wiring lines in an extremely limited space.

To meet the requirement, multi-layer technologies are being brought into use. They are methods for stacking semiconductor layers and wiring layers via inter-layer insulation films. Multi-layer technologies enable to stack electronic devices and wiring lines without increasing the device area. Moreover, by making contact holes in the inter-layer insulating films to electrically connect upper and lower layers, complex wiring can be readily realized within a limited device area.

FIG. 12 is a schematic cross-sectional view of an array substrate 130 of a liquid crystal display device made by the multi-layer technique. The array substrate 130 shown here includes a poly-silicon (poly-crystalline silicon) layer 136 formed on a glass substrate 132 via an under-coat layer 134. A gate electrode 140 and an auxiliary capacity line 142 form a transistor and a capacitor. The source electrode 146 of the transistor is formed on an insulating film 144. The pixel electrode 154 is connected to the contact electrode 148 of the transistor via a contact hole 150a formed in the insulating film 150. A multi-layer technique is used in the layer under the source electrode 146 and the layer under the pixel electrode 154.

However, when a metal electrode and a semiconductor layer are stacked via an inter-layer insulating film as shown in FIG. 12, so-called cross talk occurs and causes an interference between signals which cannot be neglected. Moreover, an electrode layer and a semiconductor layer confronting with each other via an insulating film form a capacitor, and produces a coupling capacitance which causes problems, such as decrease of the response speed of the device.

For example, in the array substrate 130 shown in FIG. 12, the source electrode 146 supplies different signals as a signal line to other transistors not shown. However, as shown in FIG. 12 by the symbol A, the source electrode 146 and the pixel electrode 154 locally overlap via the inter-layer insulating film 150, and cross-talk or coupling capacitance occur in the overlapping portion. This causes problems, such as increase of noise components in a video signal, decrease of the video display quality due to a slow-down of the driving speed, and so on.

Additionally, wiring layers and other conductive layers on and under an inter-layer insulating film are patterned in many cases. Therefore, as the number of stacked layers increases, the surface unevenness becomes prominent, and makes it more difficult to form a multi-layered structure.

In order to prevent these problems, namely, an increase in cross-talk, coupling capacitance and surface unevenness, the inter-layer insulating film must be thick. However, conventional inter-layer insulating films made of inorganic materials are subject to cracking or peeling when they are thicker than hundreds of nm, and are unsuitable for use as thick films. On the other hand, inter-layer insulating films made of organic materials can be stacked thick, but cannot promise a sufficient reliability due to their high moisture permeability.

Another problem contained in multi-layered structures is step-off breakage of conductive layers at contact holes. Namely, when a conductive layer is stacked on an inter-layer insulating film having a contact hole, the thickness of the conductive layer becomes thinner on the inner wall surface of the contact hole, and readily broken there. For example, in FIG. 12, step-off breakage of the pixel electrode 154 is liable to occur at a position of the contact hole 150a shown by the arrow B. Step-off breakage inevitably causes insufficient connection between conductive layers resulting in low-quality video images of a liquid crystal display device. Step-off breakage more often occurs as the inter-layer insulating film 150 becomes thicker.

To prevent step-off breakage, the pixel electrode 154 must be thick. In a liquid crystal display deice, however, the pixel electrode 154 is typically a transparent electrode, and it is difficult to increase the thickness of the pixel electrode 154 due to a restriction by materials or its manufacturing process. Additionally, a thick conductive layer usually promotes the surface unevenness, and makes it difficult to form a multi-layered structure.

SUMMARY OF THE INVENTION

It is therefore an object of the invention to provide a reliable array substrate having an inter-layer insulating film having a sufficient thickness and preventing step-off breakage of a conductive layer at a contact hole.

Another object of the invention is to provided a liquid crystal display device using such a reliable array substrate.

Another object of the invention is to provide a method for manufacturing the array substrate and the liquid crystal display device.

According to the invention, there is provided an array substrate comprising a first conductive layer stacked on a substrate; a first inter-layer insulating film having a first hole; and a second inter-layer insulating film having a second hole, in which the inner wall surface of the first hole is covered by the wall surface of the second hole substantially concentric with the first hole so that the first inter-layer insulating film is not exposed to the inner wall surface of the second hole. Thus, the entire inter-layer insulating film can be stacked thick enough to decrease cross talk and coupling capacitance between conductive layers, and step-off breakage of the second conductive layer can be prevented. Using the array substrate, a reliable liquid crystal display device can be realized.

The first inter-layer insulating film is made of an inorganic material, and the second inter-layer insulating film is made of an organic material, so as to form an entirely thick inter-layer insulating film having a contact hole with a moderately angled inner wall surface.

When the second hole has a tapered configuration at its opening end and entirely covers the material of the first inter-layer insulating film with the material of the second inter-layer insulating material in the hole, step-off breakage of the second conductive layer is effectively prevented.

The second hole is preferably shaped so that the steepest portion of its inner wall surface makes an angle not larger than 70 degrees relative to the base plane to form a gently sloping contact hole and to effectively prevent step-off breakage of the second conductive layer.

The shape of the second hole may be circular, rectangular or polygonal to provide a sufficient contact area in a fine sizing rule.

The second hole may have an opening end forming a curved plane to prevent step-off breakage there.

Especially when the curved plane has a radius of curvature not smaller than $1 \times 10^{-8}$ m and not larger than radium $1 \times 10^{-4}$ m, step-off breakage can be prevented more effectively.

The second inter-layer insulating film is preferably stacked thicker than the fist inter-layer insulating film to increase the distance between the first conductive layer and the second conductive layer large enough to prevent cross talk or coupling capacitance.

By using the first conductive layer as the output terminal of switching elements, making the first inter-layer insulating film of a material containing at least one of silicon nitride and silicon oxide, making the second inter-layer insulating film of an acrylic resin, and using the second conductive layer as pixel electrodes for applying an electric field to a liquid crystal layer, a liquid crystal display device with a high performance and a high reliability can be realized.

A method for manufacturing an array substrate according to the invention comprises the steps of forming a first conductive layer on a base; stacking a first inter-layer insulating film on the first conductive layer; forming a first hole in the first inter-layer insulating film to extend therethrough to a top surface of the first conductive layer; stacking a second inter-layer insulating film on the first inter-layer insulating film; forming a second hole in the second inter-layer insulating film to extend therethrough and thorough the first hole to the top surface of the first conductive layer; annealing the second inter-layer insulating film to thermally contract the organic material forming the second inter-layer insulating film so as to change the opening end of the second hole to form a third hole whose inner wall surface defines a tapered opening end slanted from the base plane; and forming on the second inter-layer insulating film a second conductive layer connected to the first conductive layer through the second hole. The method can also be used to manufacture a liquid crystal display device with a high performance and a high reliability.

Preferably, the first inter-layer insulating film is made of an inorganic material, and the second inter-layer insulating film of an organic material.

In the step of making the second hole, the second hole is preferably made to have a smaller diameter than the first hole and to extend to or beyond the top surface of the first conductive layer, while covering the inner wall surface of the first hole with the material of the second insulating layer, so that the material of the first insulating layer is not exposed on the inner wall surface.

In the annealing step, the second inter-layer insulating film is preferably annealed until the inner wall surface of the second hole makes an angle of 70 degrees or less relative to the base plane.

In the step of forming the second inter-layer insulating film, the second inter-layer insulating film is preferably stacked to a thickness larger than the first inter-layer insulating film.

When using a substrate on which a plurality of switching elements a re formed, using the first conductive layer as output terminals connected to respective switching elements, using a material containing at least one of silicon nitride and silicon oxide to make the first inter-layer insulating film, using an acrylic resin to make the second inter-layer insulating film, and using the second conductive layer as pixel electrodes for applying an electric field to a liquid crystal layer, a liquid crystal display device with a high performance and a high reliability can be made.

The annealing step may be conducted at a temperature not lower than 90° C. and not higher than 300° C. to easily shape the organic material forming the second inter-layer insulating film into any desired configuration.

These and other aspects of the invention have the following effects.

First, a highly reliable liquid crystal display device can be realized. That is, the inter-layer insulating film used in the invention is a multi-layered film made by stacking a film having a protective function and a film readily stacked thick in this order. Films of inorganic materials represented by silicon nitride and silicon oxide have a low moisture permeability, and therefore ensure a reliability of the liquid crystal display device. In other words, by stacking an inorganic material film having a large passivation effect as the first inter-layer insulating film, infiltration of moisture, or the like, can be prevented, and a semiconductor device using such a film promises a long-run reliability.

Films of organic materials, such as acrylic resin, can be readily stacked thick and are suitable for reducing cross talk or coupling capacitance and for making a smooth surface. By employing the multi-layered structure of an inorganic material film and an organic material film, a reliable, thick inter-layer insulating film can be made easily. That is, according to the invention, the inter-layer insulating film between the metal wiring layer and semiconductor layer, for example, can be made sufficiently thick. Therefore, cross talk or coupling capacitance between upper and lower layers can be suppressed effectively. As a result, noise characteristics or response characteristics of a liquid crystal display device can be improved.

Moreover, according to the invention, the inner wall surface of the contact hole can be slanted more gently. Therefore, step-off breakage does not occur in a conductive layer as thin as 100 nm or less. In addition to this, even when the inter-layer insulating layer is much thicker than conventional one, step-off breakage is less. Therefore, the invention removes malfunction of a liquid crystal display device caused by step-off breakage, improves the production yield, and improves the reliability.

Furthermore, according to the invention, the surface of a semiconductor device can be smoothed. That is, by stacking an organic material thick as the second inter-layer insulating film, unevenness on the surface derived from a patterned conductive layer, for example, can be flattened. Therefore, some multi-layered structures can be stacked to realize a higher integration of a liquid crystal display device.

Additionally, the second inter-layer insulating film used in the invention does not directly contact with the semiconductor film. That is, according to the invention, a gate insulating film, insulating film, first inter-layer insulating film or pixel contact is interposed between the semiconductor film and the second inter-layer insulating film. As a result, the invention prevents an impurity from diffusing from the organic material of the second inter-layer insulating film into the semiconductor film, and thereby prevents deterioration of TFT.

That is, the invention can realize a liquid crystal display device having excellent electric characteristics, preventing malfunction caused by step-off breakage, enabling high integration, and promising a high reliability, which all are great advantages for the industry. Moreover, since a flat or smooth surface can be made easily, the invention is suitable for use in a reflection type display using an aluminum or other metal electrode in lieu of the transparent electrode (ITO), and various applications of the invention are expected.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Explained below are embodiments of the invention with reference to the drawings.

Figure 1:
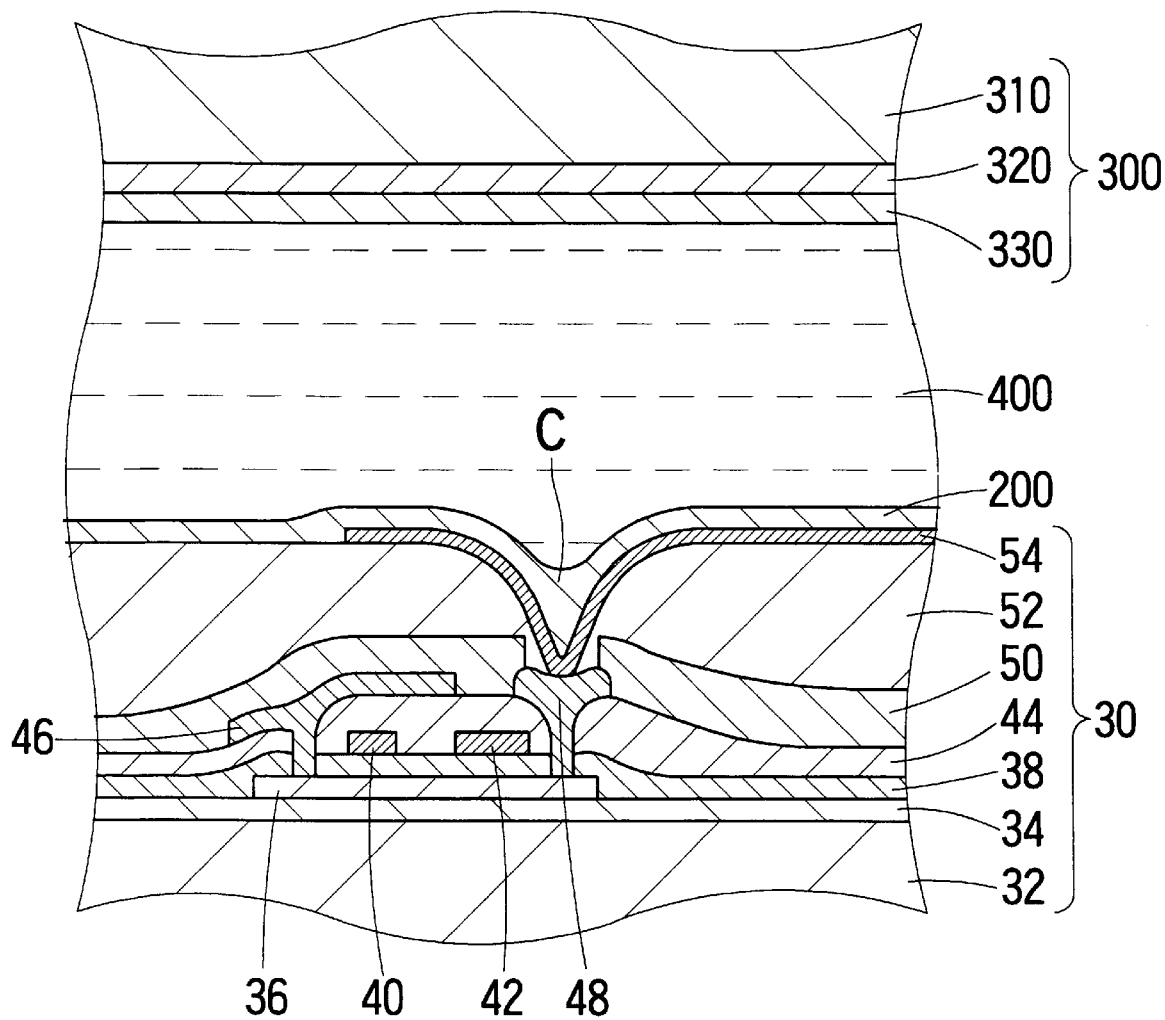
FIG. 1 is a schematic cross-sectional view of a liquid crystal display device according to the invention.

FIG. 1 is a fragmentary schematic cross-sectional diagram showing a major part of a liquid crystal display device according to the invention. The liquid crystal display device shown here is a transmission type liquid crystal display device which includes an array substrate 30, an opposite substrate 300 facing to the array substrate, and a liquid crystal layer 400 held between these substrates. Formed on the array substrate 30 are a plurality of switching elements and an alignment layer 200 thereon. The opposite substrate has a transparent electrode 320 and an alignment layer 330. The opposite substrate 300 may also include a color filter layer and a black matrix layer not shown.

The array substrate 30 according to the invention is different from the conventional array substrate 130 in the construction of layers under pixel electrode 54. More specifically, a first inter-layer insulating film 50 is stacked on a contact electrode 48, and a second inter-layer insulating film 52 is formed thereon. In the other respects, the basic construction is substantially the same as the conventional one. That is, the array substrate 30 includes a semiconductor layer 36 of poly-silicon or amorphous silicon, for example, formed on a glass substrate 32 via an under-coat layer 34. A gate electrode 40 and an auxiliary capacity line 42 form a transistor and a capacitor. The pixel electrode 54 is connected to the contact electrode 48 through a contact hole C. Therefore, a multi-layer technique is applied to layers under the source electrode 46 and layers under the pixel electrode 54.

Since the second inter-layer insulating film 52 is interposed, the pixel electrode 54 is sufficiently distant from the conductive layer to effectively reduce cross talk or coupling capacitance. As a result, an unevenness of the displayed image may be suppressed sufficiently.

In the structure of the invention, the inner wall surface of the contact hole C made in the second inter-layer insulating film 50 has a tapered opening end. The inner wall surface of the hole made in the first inter-layer insulating film 50 is covered by the second inter-layer insulating film 52, and is not exposed to the inner surface of the contact hole C. Therefore, the inner wall surface of the contact hole C defines a continuous, gentle slope. Moreover, the upper end of the contact hole C is gently rounded. Due to the unique configuration of the contact hole C, the pixel electrode 54 is reliably held in contact with the contact electrode 48 without a step-off breakage.

Next explained is a manufacturing method according to an embodiment of the invention.

FIGS. 2A through 3C are schematic cross-sectional views of a major part of a liquid crystal display device in different steps of the manufacturing process.

Figure 2A:
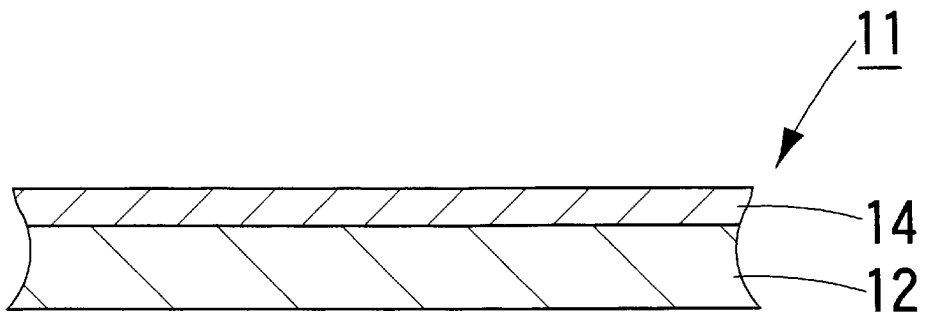
FIGS. 2A through 2D are schematic cross-sectional views of an array substrate according to the invention in different earlier stages of a manufacturing process.

As shown in FIGS. 2A, here is taken an array substrate 11 in which a conductive layer 14 is stacked on a glass substrate 12. The array substrate 11 shown here is only an example. For example, the conductive layer 14 may be patterned where necessary, and one or more layers including a semiconductor layer may be interposed between the glass substrate 12 and the conductive layer 14. For simplicity, the array substrate 11 having an aluminum wiring layer 14 on the glass substrate 12 is shown here.

According to the invention, a multi-layered structure stacking a conductive layer on the conductive layer 14 via an inter-layer insulating film can be made.

Figure 2B:
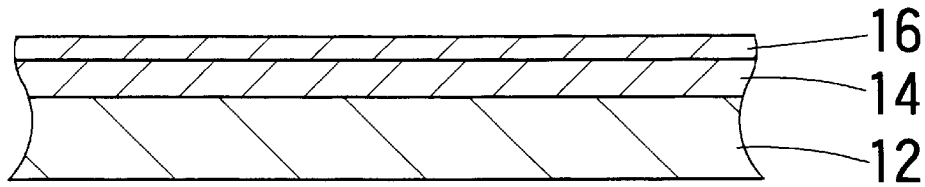

As shown in FIG. 2B, a material having a protective function is stacked to form a first inter-layer insulating film 16. Usable as its material are, for example, inorganic materials such as silicon nitride and silicon oxide. The material of the insulating layer 16 is preferably selected on account of the adhesivity with the conductive layer 14, characteristic such as thermal expansion ratio and dielectric constant, stacking conditions such as stacking temperature, and so forth. In case of a transmission type liquid crystal display device, the optical characteristic such as transmission coefficient and absorption coefficient should be considered to select the material of the film 16. In case of a normal liquid crystal display device, silicon nitride, silicon oxide, and their mixture, silicon nitride oxide, widely used as a protective film, are preferable materials. If silicon nitride or silicon oxide is selected to form the film 16, the thickness thereof preferably be set in the range of 250 nm to 900 nm. In the example shown here, silicon nitride is stacked to a thickness about 500 nm by plasma CVD(chemical vapor deposition).

Figure 2C:
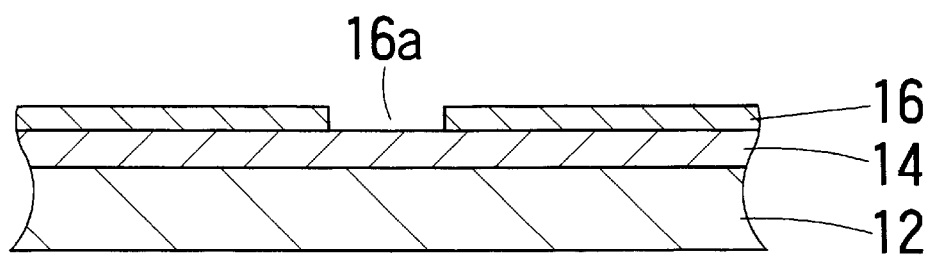

As shown in FIG. 2C, the first inter-layer insulating film 16 is patterned to make holes 16a. The holes 16a are used as contact holes. Lithography using a photo resist, for example, may be used for patterning the insulating film 16. For etching the insulating film 16, any appropriate method is used on account of the material and thickness. In the example shown here, the inter-layer insulating film 16 is etched by CDE (chemical dry etching) to make circular holes each having a diameter around 8 $\mu$m.

Figure 2D:
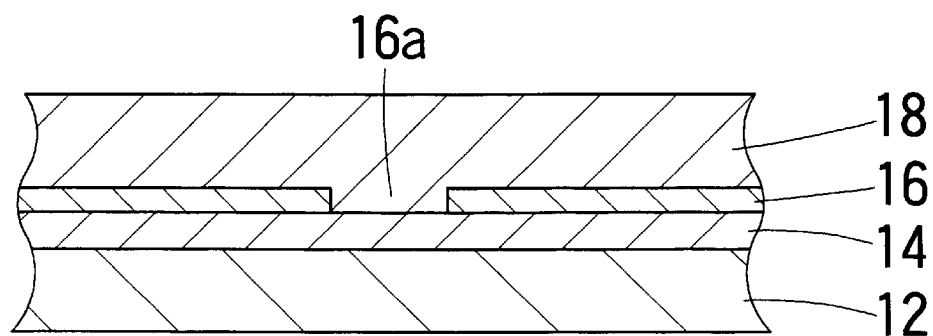

Next, as shown in FIG. 2D, a second inter-layer insulating film 18 is formed by stacking a material which at can be readily stacked thick. Upon selecting the material, stacking method and thickness of the insulating film 18, adhesivity with the insulating film 16, material property including dielectric constant, stacking conditions, optical characteristic, and so forth, are preferably taken into consideration. An organic material is an appropriate material of the insulating film 18, and its thickness is preferably 0.5 $\mu$m more.

In the example shown here, a photosensitive acrylic resin (containing naphthoquinone diazide as a photosensitive agent) is deposited to a thickness about 2 $\mu$m. By using a photosensitive material, a photo resist need not be used for patterning. Usable as the material of the insulating film 18 is a polyimide resin.

Figure 3A:
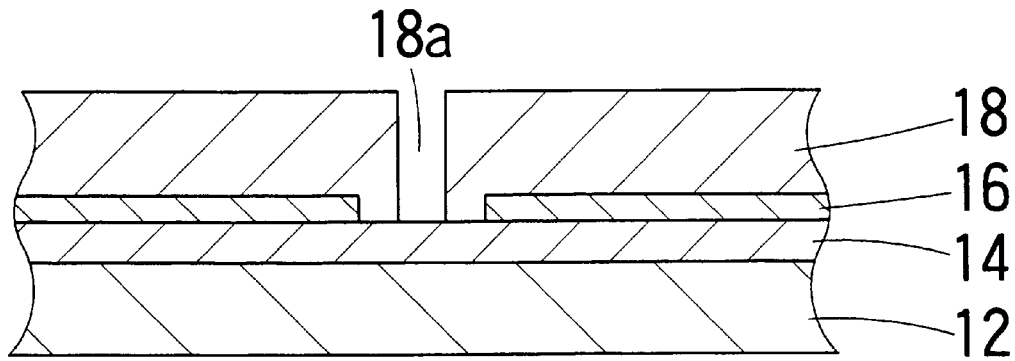
FIGS. 3A through 3C are schematic cross-sectional views of the array substrate according to the invention in different latter stages of the manufacturing process.

Next, as shown in FIG. 3A, the second inter-layer insulating film 18 is patterned to make holes 18a. Also the holed 18a are used as contact holes. The size of each hole 18a is important on account of the relation with hole 16a in the first inter-layer insulating film 16. In this embodiment, as explained later, the hole 18a must be smaller than the hole 16a. The hole 18a shown here is a round hole with the diameter of 6 $\mu$m.

Figure 3B:
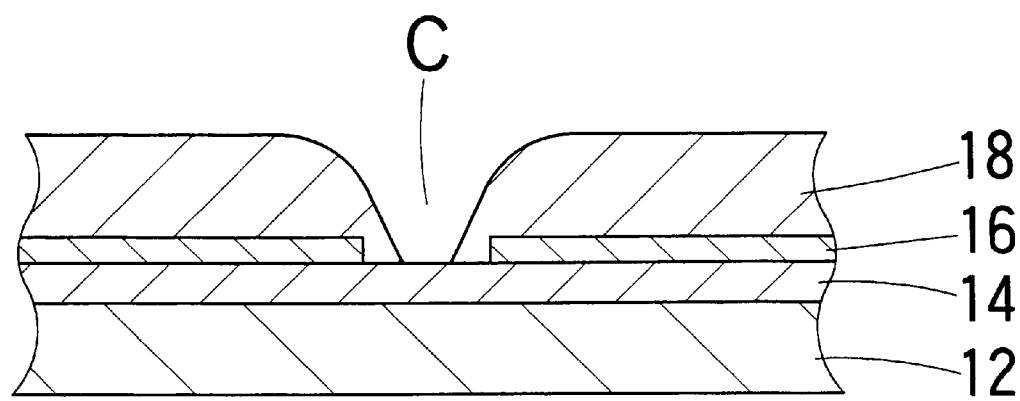

The substrate 11 is next annealed. Then, the second inter-layer insulating film 18 thermally contracts. As shown in FIG. 3B, it results in obtaining a contact hole with its inner diameter gradually increasing toward the upper end to define a gently sloped inner wall surface and to form a rounded upper end. Optimum annealing conditions for obtaining the configuration can be selected on account of the material and thickness of the second inter-layer insulating film 18. The annealing temperature is preferably within the range from 90° C. to 300° C. At lower temperatures, thermal reaction and curing are not sufficient, and higher temperatures promote carbonization of the film 18. The shape of the hole 18a can be intentionally controlled by positively changing the annealing conditions. For example, by annealing the product at temperatures in the range of 170° C. to 250° C. for 30 to 120 minutes, a contact hole having a gently sloping surface can be obtained. Actually, annealing was made at 230° C. for 60 minutes.

Figure 3C:
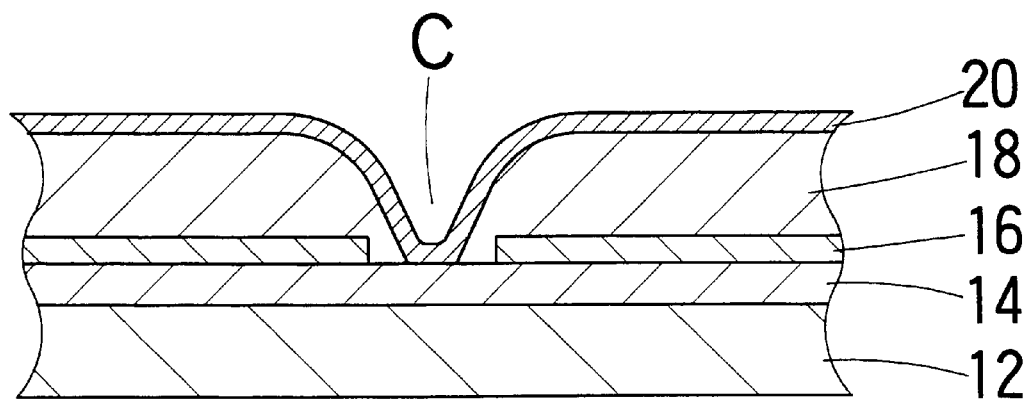

Next, as shown in FIG. 3C, a second conductive layer 20 is stacked. The conductive layer 20 is connected to the first conductive layer 14 through the contact hole C. Since the contact hole C is rounded at its upper end and has a gently sloping inner wall surface, step-off breakage does not occur there.

According to the invention, by using a multi-layered structure as the inter-layer insulating film, a sufficiently thick insulating layer can be realized. Therefore, the conventional problem, namely, an increase in cross talk or coupling capacitance between upper and lower conductive layers, can be overcome. Moreover, since the second inter-layer insulating film made of an organic material makes a flat surface, the multi-layered structure can be made easily.

Additionally, according to the invention, even though the inter-layer insulating film is thick, since the contact hole is made to define a gently sloping inner wall surface, step-off breakage of the overlying wiring layer does not occur.

Furthermore, according to the invention, since the underlying layer is protected by using the first inter-layer insulating film made of an inorganic material, the reliability of the semiconductor device is ensured. In other words, the second inter-layer insulating film 52 made of an organic material in FIG. 1 does not contact with the semiconductor layer 36, and the first inter-layer insulating film 50 and the contact electrode 48 function as a protective wall. Therefore, the semiconductor layer 36 is not contaminated by the organic resin (the impurity does not diffuse into the semiconductor layer 36), and the reliability of the semiconductor layer is maintained sufficiently.

Figure 4A:
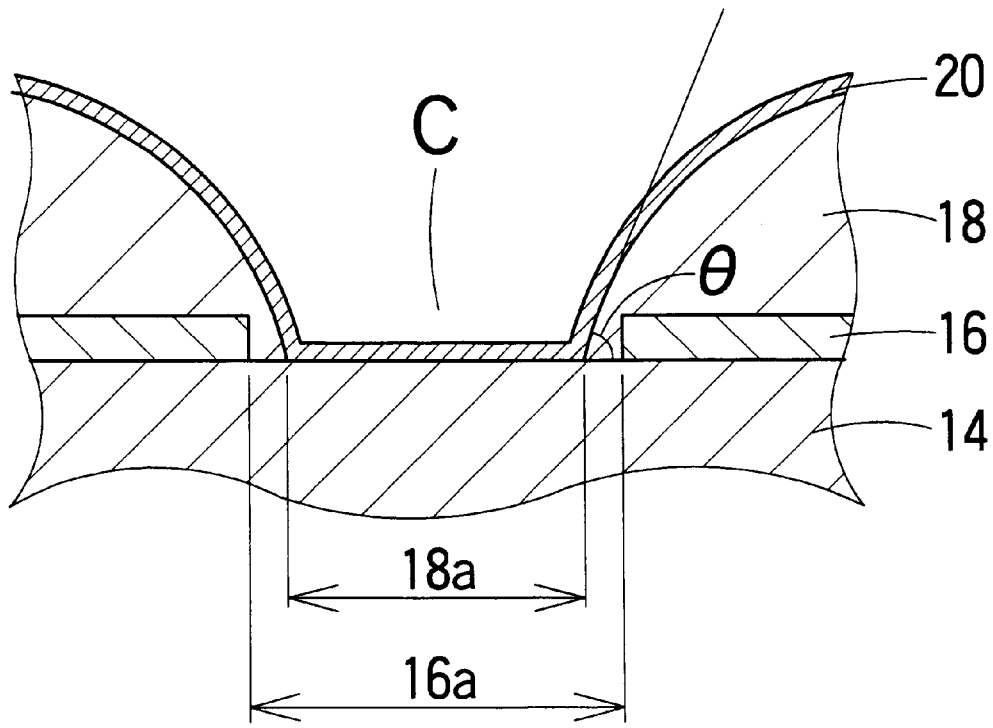
FIGS. 4A and 4B are enlarged views showing sizes of holes in first and second inter-layer insulating films during patterning according to the invention.
Figure 4B:
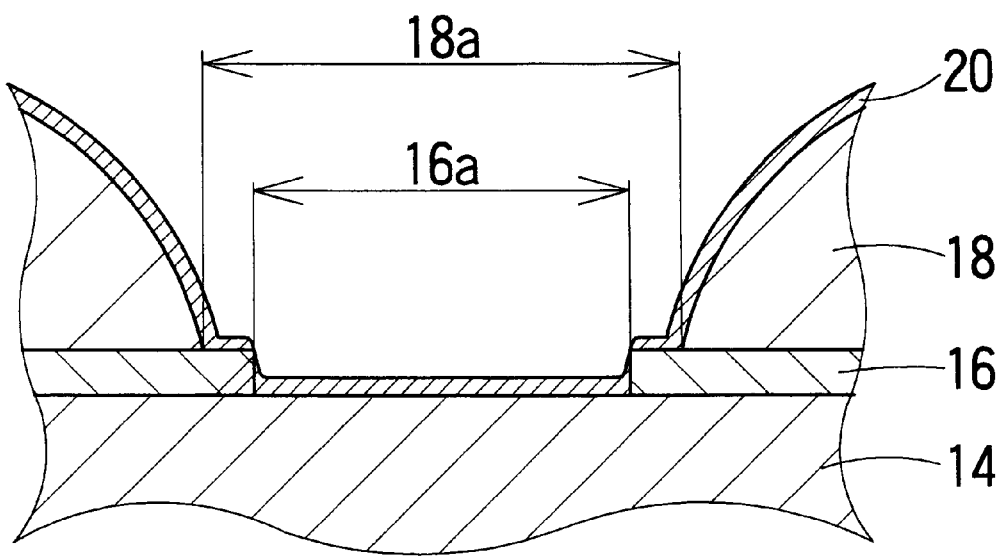

FIGS. 4A and 4B illustrate a hole in an enlarged scale to show its dimensions upon patterning the first and second inter-layer insulating films used in the invention. FIG. 4A shows an aspect where the size of the hole in the first inter-layer insulating film just patterned is larger, and FIG. 4B shows an aspect where the size of the hole in the second inter-layer insulating film just patterned is larger. In FIG. 4A, the inner wall surface of the hole 16a in the first inter-layer insulating film is covered by the second inter-layer insulating film, and the inner wall surface of the contact hole C defines a continuous, gentle slope. Therefore, the second conductive layer 20 stacked thereon is connected to the first conductive layer 14 with no step-off breakage.

In FIG. 4B, however, since the hole 16a in the first inter-layer insulating film is smaller than the hole 18a in the second inter-layer insulating film, the inner wall surface of the hole 16a is not covered by the second inter-layer insulating film. As a result, a step is formed on the inner wall surface of the contact hole. The step and the exposed part of the first inter-layer insulating film on the inner wall surface of the contact hole are apt to cause step-off breakage. That is, in order to prevent step-off breakage of the conductive layer, it is important to size the hole 18a in the second inter-layer insulating film equal to or larger than the hole 16a in the first inter-layer insulating film.

The Inventors made further reviews about optimization of the shape of the hole C, considering that "step-off breakage" more often occurs at the connecting portion of the electrode in the hole as the inter-layer insulating film becomes thicker. Especially in an array substrate used in a liquid crystal display device, the pixel electrode made on the hole C is typically as very thin as 100 nm or less, and "step-off" often breakage occurs there.

Taking it into account, the Inventors prepared some devices having the structure shown in FIG. 4A but having different shaped holes C, and evaluated the quality of connection of the electrode 20. In the samples used here, while fixing the diameter of the hole C at its bottom to 5 $\mu$m in all samples, the radius curvature at the opening end and the slanted angle of the inner wall surface of the hole was changed variously. The thickness of the inter-layer insulating film 18 was 2 $\mu$m and the thickness of the electrode 18 was 100 nm in all samples.

Figure 5:
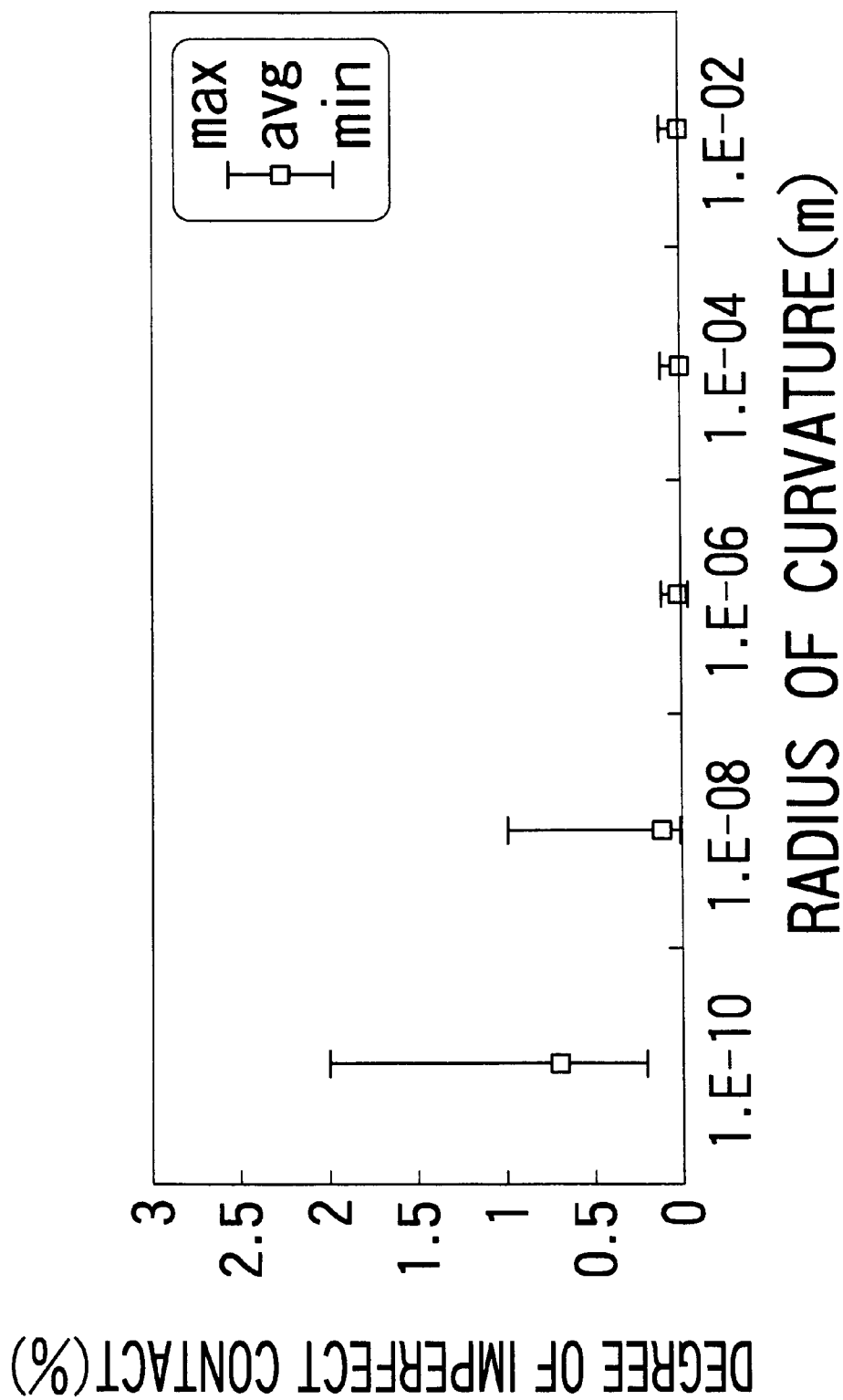
FIG. 5 is a graph showing a relation between the radius of curvature of the opening end of a hole C and the degree of imperfect contact.

FIG. 5 is a graph showing a relation between the radius of curvature at the opening end of the hole C and the degree of imperfect contact obtained by evaluating 10000 samples. It is known from FIG. 5 that the degree of imperfect contact extremely increases when the radius of curvature at the opening end of the hole is smaller than 1×10$^{-8}$ m. That is, it has been confirmed that the radius of curvature at the opening end of the contact hole must be adjusted when making a relatively thick inter-layer insulating film. In contrast, if the radius of curvature is excessively large, the thickness of the inter-layer insulating film around the hole does not reach a predetermined value in an acceptable area, and the excessively large opening makes the design of the pixel construction difficult. Therefore, the radius of curvature at the opening end of the hole is preferably limited in the range from 1×10$^{-8}$ m to 1×10$^{-4}$ m.

The inner wall surface of the hole is preferably slanted than being vertical relative to the base plane. By a similar experiment, it has been confirmed that the sloping angle $\theta$ of inner wall surface of the hole be not larger than 70 degrees to reliably decreasing the degree of imperfect contact. That is, it has been confirmed that, by making a tapered hole whose inner wall surface has a slanted angle of 70 degrees or less, the problem of "step-off breakage" of electrodes can be removed substantially.

The foregoing embodiment has been explained, taking a process of patterning the first inter-layer insulating film and the second inter-layer insulating film separately to make the holes. However, the holes may be made in the insulating layers in a single patterning process after stacking the first and second inter-layer insulating films. In this case, the holes have almost the same size. However, in the annealing step executed later, the organic material of the second inter-layer insulating film can be softened to cover the inner wall surface of the hole in the first insulating layer before it thermally contracts. This method is made possible by selecting an appropriate material of the second insulating layer and appropriate annealing conditions. By using this method, the patterning process is simplified.

As another embodiment, after the first insulating layer and the second insulating layer are stacked and covered by a mask for making holes, they may be etched in different steps. For example, the organic material film used as the second insulating film is etched by an etchant for exclusive use to organic materials to make holes. Next made is wet etching using hydrofluoric acid or other etchant to selectively remove the organic material film as the first insulating film. As a result, the hole formed in the first insulating layer becomes wider than the hole in the second insulating film due to side etching. Therefore, by softening the organic material of the second insulating film in a subsequent annealing step, part of the organic material can be moved onto the inner wall surface of the first insulating film to cover it entirely. Also this process simplifies the patterning process.

As a further embodiment, the inter-layer insulating film has a multi-layered structure including these or more layers. For example, after stacking silicon nitride, silicon oxide and an organic resin in this order, and making holes, the structure may be annealed. Alternatively, the inter-layer insulating film may be made as a multi-layered film by changing the material or materials of one or both of the inorganic material film and the organic material film. The use of a multi-layered structure as the insulating film is advantageous in, for example, alleviating the difference in thermal expansion ratio from the conductive layer while maintaining the adhesive strength with the conductive layer. That is, by stacking a thin film of an organic material with a high adhesivity with the first conductive layer and stacking on it a relatively thick film of an inorganic material with a thermal expansion ratio similar to that of the first conductive layer, and by stacking thereon a predetermined organic material film, an inter-layer insulating film maintaining a high adhesivity and not subject to cracking even upon changes in temperature can be obtained.

As an embodiment of the invention, a method for manufacturing a liquid crystal display device is explained below. The explanation is made as fabricating a liquid crystal panel, three inches thick, for use in an liquid crystal projector.

FIGS. 6A through 7B are schematic cross-sectional views of a part of the liquid crystal display device in different steps of the manufacturing process.

Figure 6A:
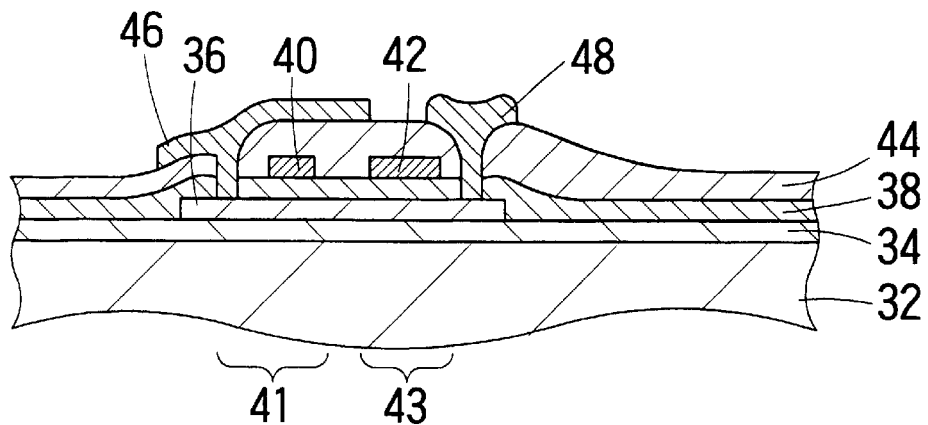
FIGS. 6A through 6C are schematic cross-sectional views of an array substrate according to the invention in different steps of a manufacturing process.

As shown in FIG. 6A, a thin film transistor (TFT) 41 and an auxiliary capacity line 43 are first formed on a glass substrate 32. Its manufacturing process is explained below.

An under-coat layer 34 is stacked on the glass substrate 32, and an amorphous silicon film is stacked thereon by plasma CVD. The amorphous silicon film is thereafter crystallized by laser annealing to form a poly-silicon film 36. The poly-silicon film 36 is next patterned into a predetermined configuration, and a gate insulating layer 38 is staked thereon. By further stacking and patterning a metal film, a gate electrode 40 and an auxiliary capacity electrode 42 are formed. Then, these electrodes are masked, and an impurity is introduced into the poly-silicon film 36 by ion implantation. After stacking an insulating film 44 and making a contact hole, a multi-layered film having an aluminum layer and a molybdenum layer is formed and is patterned to form a signal line 46 and pixel contacts 48. The process using these steps may be based on conditions for making a poly-silicon TFT called "top-gate structure" among artisans. There follows the process for making the inter-layer insulating film, which is one of targets of the invention.

Figure 6B:
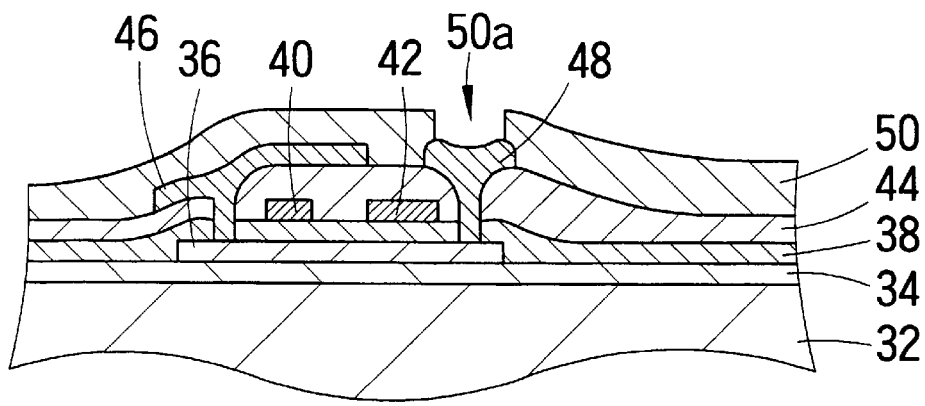

As shown in FIG. 6B, the first inter-layer insulating film 50 is stacked, and a hole 50a is formed to extend therethrough to the pixel contact 48. The fist inter-layer insulating film 50 shown here is made by stacking silicon nitride to 500 nm by plasma CVD. After that, by applying a photo resist as a mask, the insulating film 50 is etched by CDE to form the hole 50a. The hole 50a made here is circular and has the diameter of 6 μm.

Figure 6C:
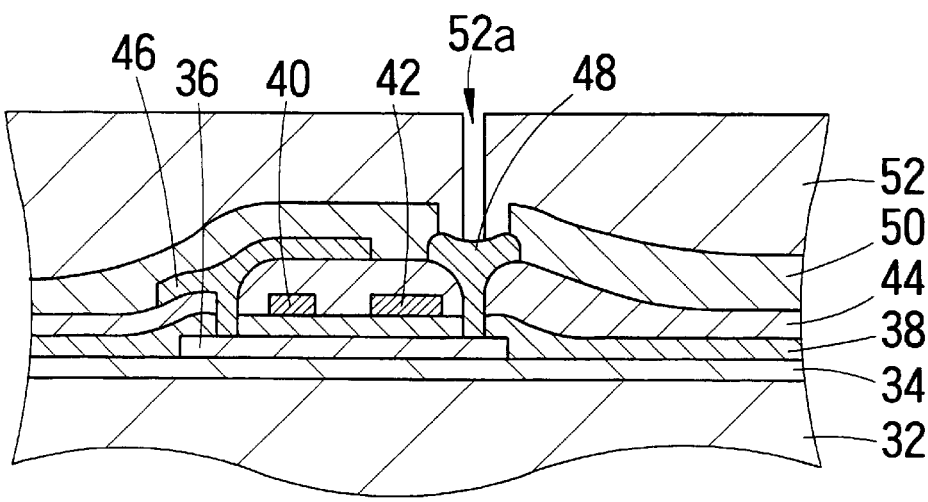

Next, as shown in FIG. 6C, the second inter-layer insulating film 52 is stacked, and the hole 52a is formed to extend therethrough to the pixel contact 48. The second int layer 52 shown here is made by stacking a photosensitive acrylic resin up to the thickness of 2 μm to ensure sufficient smoothness of the surface and sufficient suppression of coupling capacitance, etc. between electrodes. Since the second inter-layer insulating film 52 is made of a photosensitive material, the hole can be made without using a resist. That is, by exposure using a photo mask and development, the hole 52a can be made. The hole 52a in the insulating film 52 has a circular shape with the diameter of 5 μm. Since the hole 52a is made smaller than the hole 50a in the first inter-layer insulating film, the inner wall surface of the hole 50a is covered by the acrylic resin, and not exposed into the hole 52a.

Figure 7A:
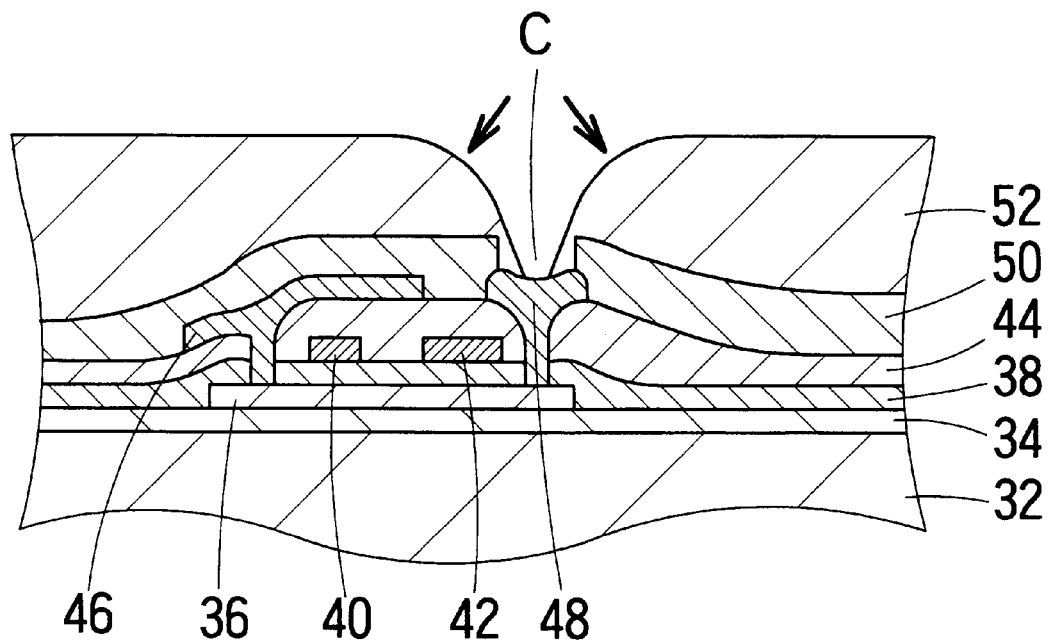
FIGS. 7A and 7B are schematic cross-sectional views of the array substrate according to the invention in different steps of a manufacturing process.

Next, as shown in FIG. 7A, the product is annealed to make the contact hole C with a predetermined configuration. That is, when annealed, the second inter-layer insulating film 52 thermally contracts, and the hole 52a is deformed into the contact hole C with a gradually enlarged opening end. Actually, by annealing the product at 230° C. for approximately one hour, the contact hole C having a continuously gently sloped inner wall surface as shown in FIG.

6A could be obtained. Additionally, the opening edge of the contact hole C shown by the arrow C in FIG. 7A could be especially rounded to make a configuration that can prevent step-off breakage of conductive layers.

Figure 7B:
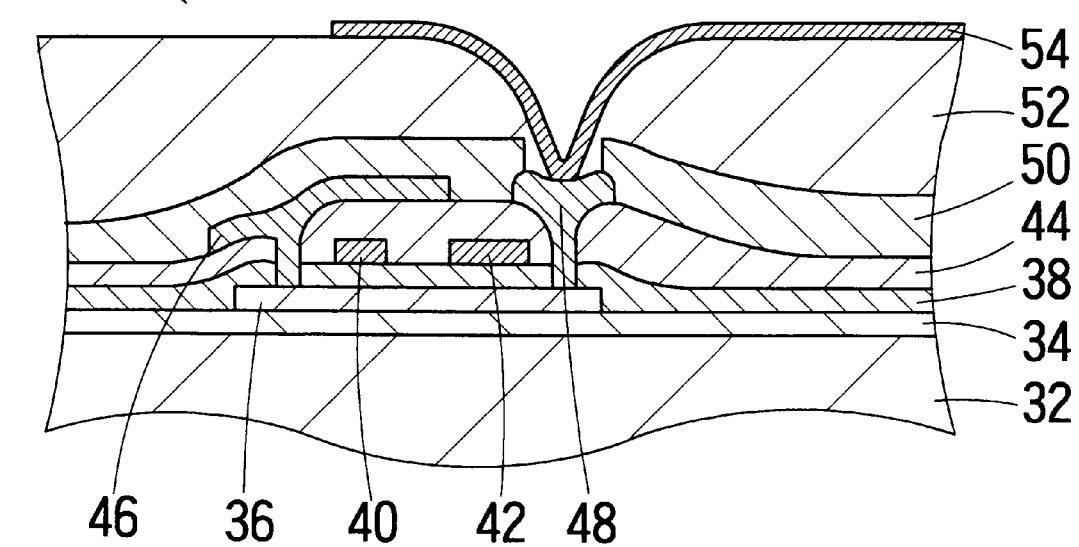

Next, as shown in FIG. 7B, the pixel electrode 54 is made. In this example, indium tin oxide(ITO) stacked to 100 nm is patterned to form the pixel electrode 54. The array substrate made in this manner is coated with an appropriate material to form an alignment layer if it is necessary, then is bonded to an opposite substrate, keeping an enclosed gap therebetween. By introducing and sealing a liquid crystal in the gap, a three-inch liquid crystal display device is completed. As a result of evaluation of actually completed liquid crystal display devices, the ratio of imperfection by step-off breakage of the pixel electrode 54 was substantially zero.

The thickness of ITO forming the pixel electrode 54 is desired to be relatively thin on account of the optical transmittance. Typically, it is used as a film as thin as 100 nm to 150 nm. In conventional devices, step-off breakage is liable to occur at the contact hole even when he inter-layer insulating film is not so thick, and there is the tendency that the ratio of imperfection caused by step-off breakage suddenly increases when a contact hole with a substantially vertical inner wall surface is made by dry etching or the thickness of the inter-layer insulating film is increased.

As a result of evaluation of samples prepared by the Inventors, when the contact hole is made by etching a single-layer inter-layer insulating film of an inorganic material by RIE (reactive ion etching) was as high as 0.3 to 3%. Such imperfection by step-off breakage appeared as a number of point defects on the screen of the liquid crystal display device.

Also in samples of the multi-layered structure stacking an inorganic material insulating film and an organic material insulating film, when the hole in the inorganic material film is smaller than the hole in the organic material film as shown in FIG. 4B, it has been confirmed that step-off breakage of the pixel electrode occurs by the a ratio of imperfection of 2 to 4%, probably because step-off breakage occurs at a number of holes in the inorganic material film or at many portions along the stacked interface.

In contrast, in the device according to the invention, it has been confirmed that the ratio of imperfect contact of the pixel electrode is substantially zero and that step-off breakage can be prevented effectively. That is, the invention has been proved to be remarkably effective, making the hole in the organic material film larger than the hole in the inorganic material film.

Additionally, the liquid crystal display device according to the invention effectively suppresses an increase in coupling capacity and cross talk between the pixel electrode 54 and the signal line 46 since the insulating films 50 and 52 are sufficiently thick. Therefore, the liquid crystal display device has a high response speed, and provide high-quality images with a remarkably few noise component.

Also through a reliability evaluation test, in conventional liquid crystal display devices using only an organic resin film, imperfection frequently occurred because of a moisture permeability of the organic resin film; however, in liquid crystal display devices according to the invention, imperfection did not occur, and a reliability of the devices was confirmed. This probably relies on a moisture blocking effect of the silicon nitride film used as the first inter-layer insulating film.

Moreover, according to the invention, as shown in FIG. 7B, the poly-silicon film 36 does not contact directly with the insulating film 52. Therefore, the poly-silicon film is protected from contamination. That is, interposed between the poly-silicon film 36 and the insulating film 52 are the gate insulating film 38, insulating film 44 and the first inter-layer insulating film 50 or pixel contact electrode 48. Therefore, diffusion of an impurity from the organic material of the insulating film 52 into the poly-silicon film 36 is restricted, and deterioration of TFT is prevented.

Next explained is the second embodiment of the invention.

Figure 8:
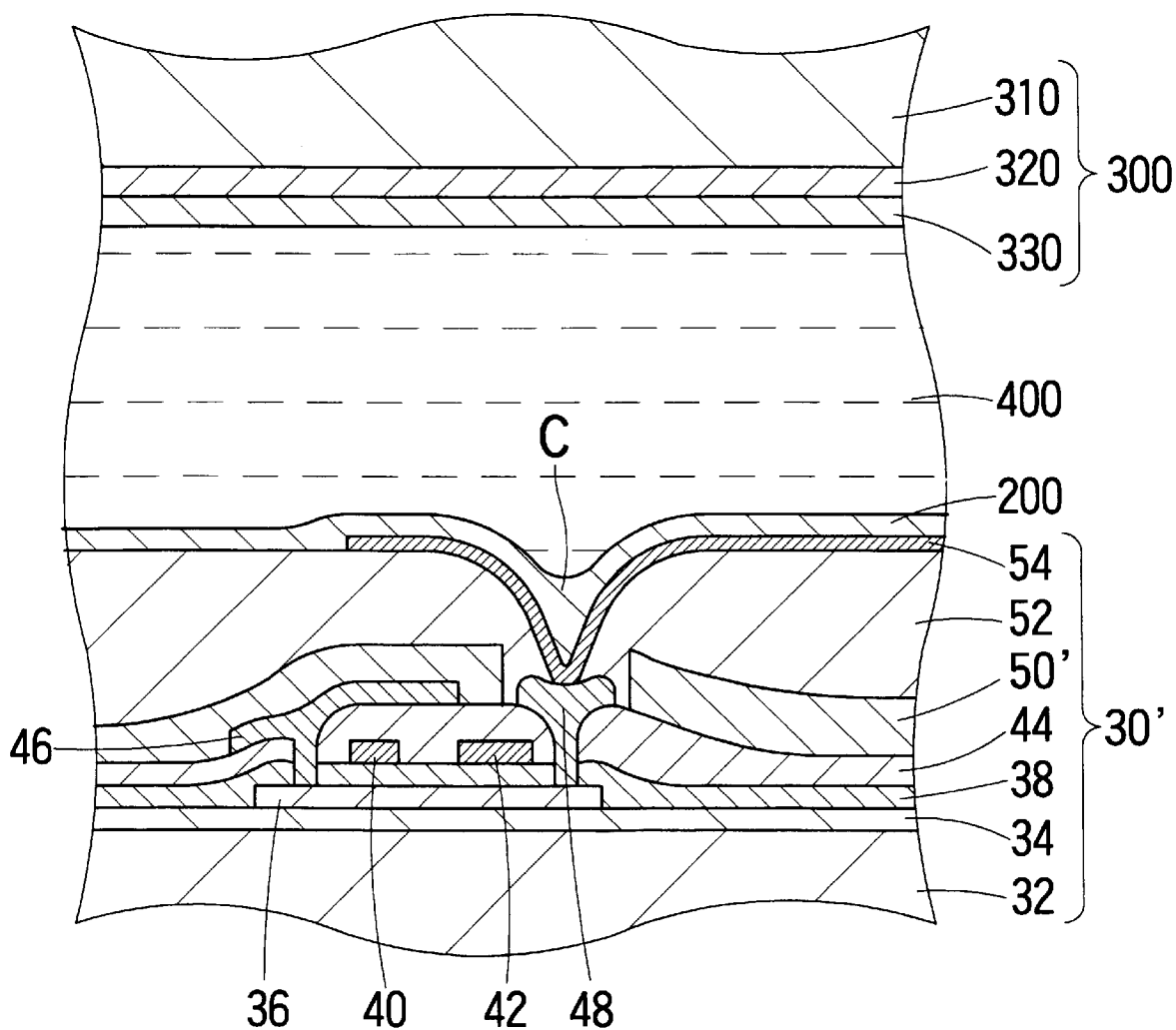
FIG. 8 is a schematic cross-sectional view of a liquid crystal display device according to the second embodiment of the invention.

FIG. 8 is a schematic cross-sectional view partly showing a liquid crystal display device according to the second embodiment. Here again, the liquid crystal display device includes an array substrate 30', an opposite substrate 300 disposed in confrontation with the array substrate, and a liquid crystal layer 400 held between these substrates.

The opposite substrate 300 includes a transparent electrode 320 and an alignment layer 330 on a major surface of a light transmitting substrate 310. The opposite electrode 300 may include a color filter layer and a black matrix layer not shown.

Like the array substrate explained with reference to FIG. 1, the array substrate 30' includes the poly-silicon film 36, gate insulating layer 38, second inter-layer insulating film 52, and others, on the substrate 32. The same or equivalent elements as those in the array substrate shown in FIG. 1 are labelled with common reference numerals, and their detailed explanation is omitted here.

A difference of the liquid crystal display device according to the second embodiment from the device of FIG. 1 lies in the first inter-layer insulating film 50'. In this embodiment, the inter-layer insulating film 50' does not overlie the pixel contact layer 48 but is kept off therefrom by a distance. In this structure of the inter-layer insulating film 50', the distance from the inner wall surface of the second hole C to the inter-layer insulating film 50' can be increased. Therefore, the inter-layer insulating film 50' is more reliably covered not to expose the inner wall surface of the hole C. Here again, the hole C has a gently sloped inner wall surface, and prevents step-off breakage of the pixel electrode 54. Also the other various advantages can be obtained here gain. Also in this embodiment, the gate insulating layer 38 and the insulating layer 44 are formed under the inter-layer insulating film 50'. Therefore, even when the first inter-layer insulating film 50 is isolated from the pixel contact 48, the poly-silicon film 36 never contacts with the second inter-layer insulating film 52. That is, the poly-silicon film 36 is not contaminated by the organic material forming the inter-layer insulating film 52.

Next explained is the third embodiment of the invention.

Figure 9:
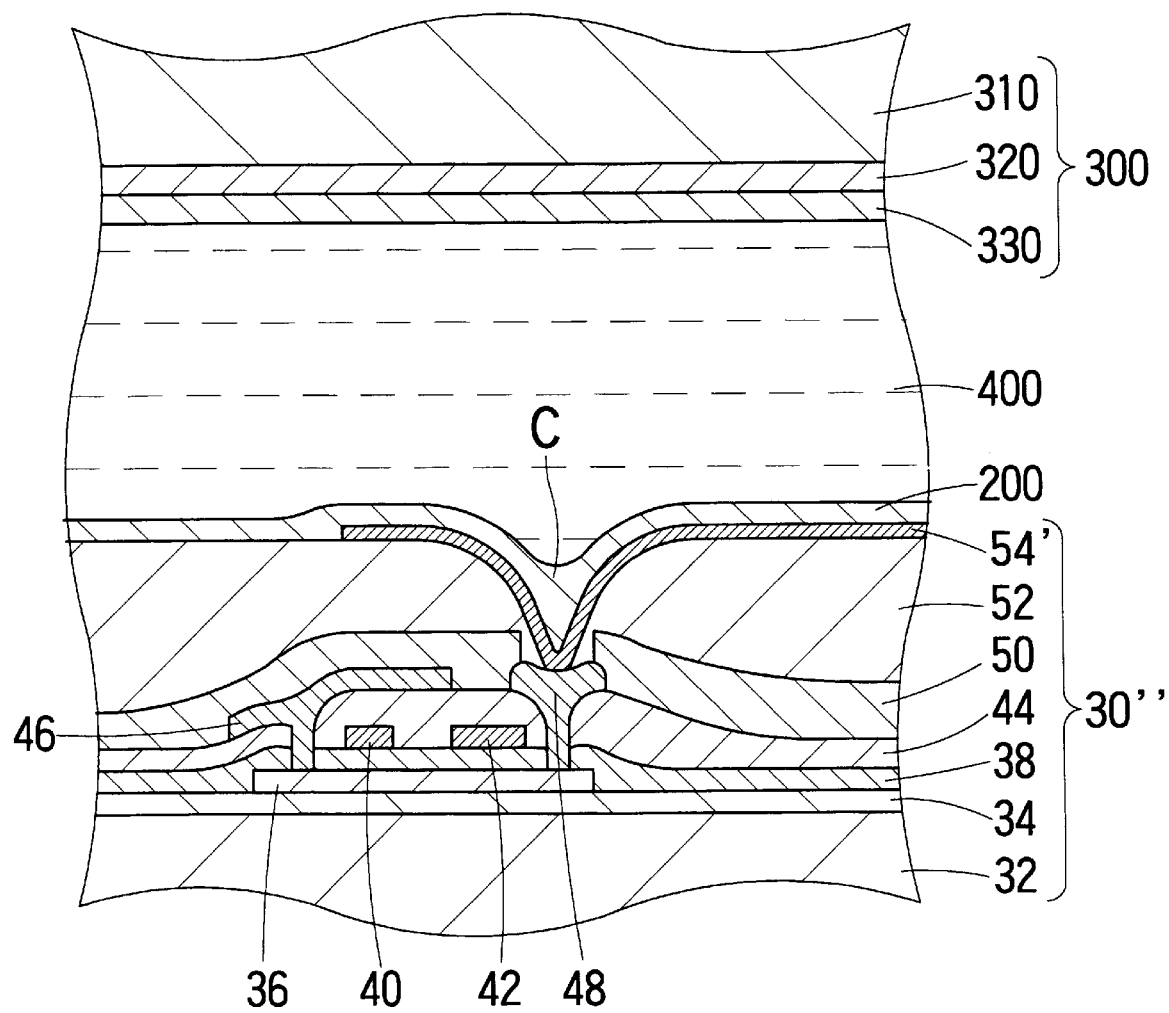
FIG. 9 is a schematic cross-sectional view of a liquid crystal display device according to the third embodiment of the invention.

FIG. 9 is a schematic cross-sectional view showing a major part of a liquid crystal display device according to the third embodiment. The liquid crystal display device shown here is a reflective type liquid crystal display device including an array substrate 30", and an opposite substrate 300 in confrontation therewith, and a liquid crystal layer 400 held between these substrates.

The opposite substrate 300 includes the transparent electrode 320 and the alignment layer 33 formed on a major surface of the light transmitting substrate 310. The opposite substrate 300 may include a color filter layer and a black matrix layer not shown.

Like the array substrate explained with reference to FIG. 1, the array substrate 30" includes the poly-silicon film 36, gate insulating layer 38, first inter-layer insulating film 50, second inter-layer insulating film 52, and others, on the substrate 32. The same or equivalent elements as those in the array substrate shown in FIG. 1 are labeled with common reference numerals, and their detailed explanation is omitted here. A difference of the liquid crystal display device according to the third embodiment from the device of FIG. 1 lies in the electrode 54' made of a reflective material. More specifically, the electrode 54' is made of, for example, aluminum. In this embodiment, incident light from above the opposite substrate 300 passes through the liquid crystal layer 400, and, after reflected by the electrode 54 on the array substrate 30'', again passes through the liquid crystal layer 400 and the opposite electrode 300 to be observed there. Also in the array substrate 30'' according to the invention, the hole C formed in the second inter-layer insulating film 52 has a gently sloped inner wall surface covering the hole of the first inter-layer insulating film 50, and prevents step-off breakage of the electrode 54'. Here again, the device promises other various advantages mentioned above, such as a decrease in coupling capacitance, improvement of the reliability, and so on.

Next explained is the fourth embodiment of the invention.

Figure 10:
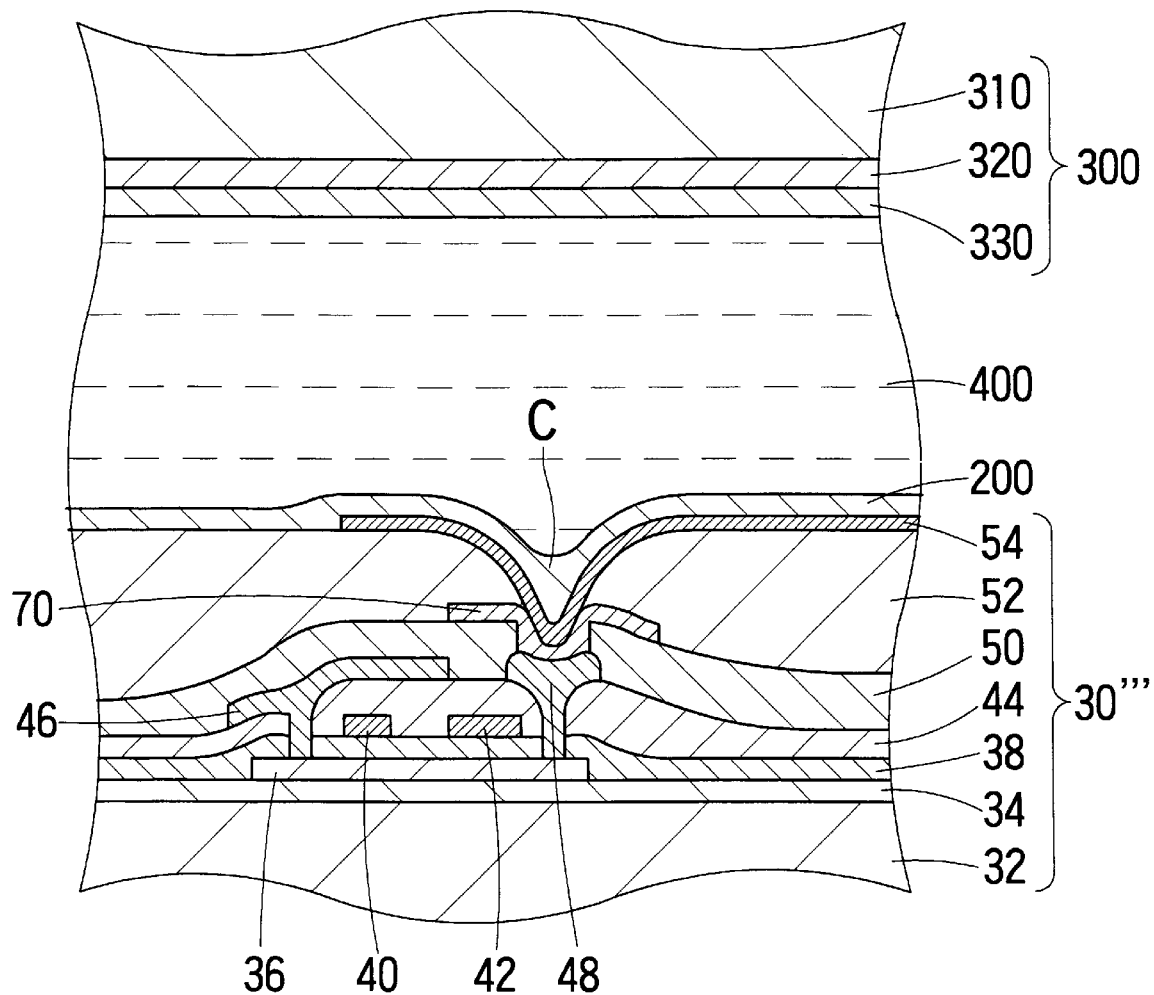
FIG. 10 is a schematic cross-sectional view of a liquid crystal display device according to the fourth embodiment of the invention.

FIG. 10 is a schematic cross-sectional view showing a major part of a liquid crystal display device according to the fourth embodiment. The liquid crystal display device shown here is a transmission type liquid crystal display device including an array substrate 30''', and an opposite substrate 300 in confrontation therewith, and a liquid crystal layer 400 held between these substrates.

The opposite substrate 300 includes the transparent electrode 320 and the alignment layer 330 formed on a major surface of the light transmitting substrate 310.

Like the array substrate explained with reference to FIG. 1, the array substrate 30''' includes the poly-silicon film 36, gate insulating layer 38, first inter-layer insulating film 50, second inter-layer insulating film 52, pixel electrode 54 made of transparent conductive material, and others, on the substrate 32. The same or equivalent elements as those in the array substrate shown in FIG. 1 are labelled with common reference numerals, and their detailed explanation is omitted here.

A difference of the liquid crystal display device according to the fourth embodiment from the device of FIG. 1 lies in the black matrix 70 which optically separates each pixel. The black matrix 70 is interposed between the contact electrode 48 and the pixel electrode 54. An optically screening material such as metal, alloy, resin, or other various non-transparent materials may be employed to form the black matrix 70.

The fabricating process is as follows. The array substrate is fabricated as described with reference to FIGS. 6A through 6B. The signal line is formed by a multi-layered film of molybdenum/aluminum/molybdenum layers. After forming a contact hole in the first inter-layer insulating film 50, a molybdenum(Mo) layer is deposited by a sputtering deposition method. The inventors formed a molybdenum layer having a thickness of more than 75 nm since the optical density of more than 2.5 is required as the black matrix 70.

After pattering the molybdenum layer to form the black matrix 70, the second inter-layer insulating film 52 is deposited, and a contact hole C is opened. A indium tin oxide layer is deposited and pattered to form the pixel electrode 54.

Also in the array substrate 30''' according to the invention, the hole C formed in the second inter-layer insulating film 52 has a gently sloped inner wall surface covering the hole of the first inter-layer insulating film 50, and prevents step-off breakage of the electrode 54. Here again, the device promises other various advantages mentioned above, such as a decrease in coupling capacitance, improvement of the reliability, and so on.

Besides, as the black matrix 70 is formed on the array substrate 30''' according to the embodiment, the process margin to align the array substrate 30''' with the opposite substrate 300 becomes much wider and the electrical contact between the contact electrode 48 and the pixel electrode 54 becomes more reliable.

As the material of the black matrix 70, any material which realize good ohmic contact both to the contact electrode 48 and to the pixel electrode 54, and is easy to form as a thin layer and to pattern, may be employed. Instead of molybdenum, alloys such as molybdenum tungsten (MoW) or silisides such as molybdenum siliside (MoSi) or tungsten siliside (WSi) may be employed as the material of the black matrix 70 as well.

Although the invention has been explained by way of preferred embodiments, the invention is not limited to these examples. The invention is applicable to all other array substrates and liquid crystal display devices configured to isolate two conductive layers by an inter-layer insulating film and to connect them via a contact hole.

Figure 11A:
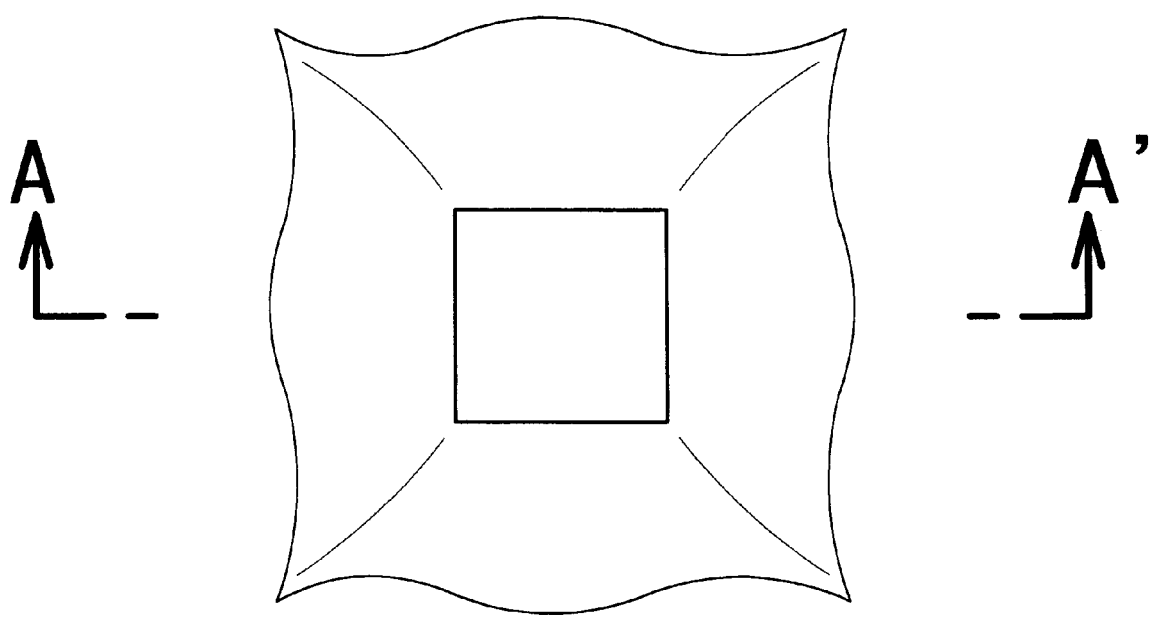
FIGS. 11A and 11B are sketches showing a rectangular hole.
Figure 11B:
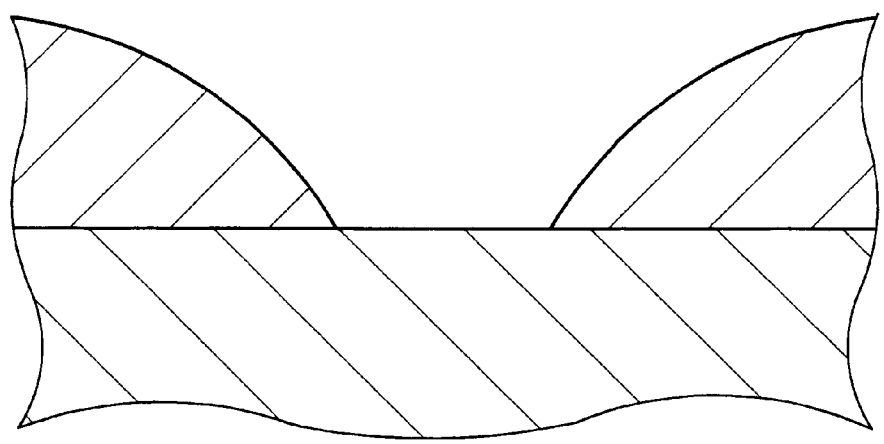
Figure 12:
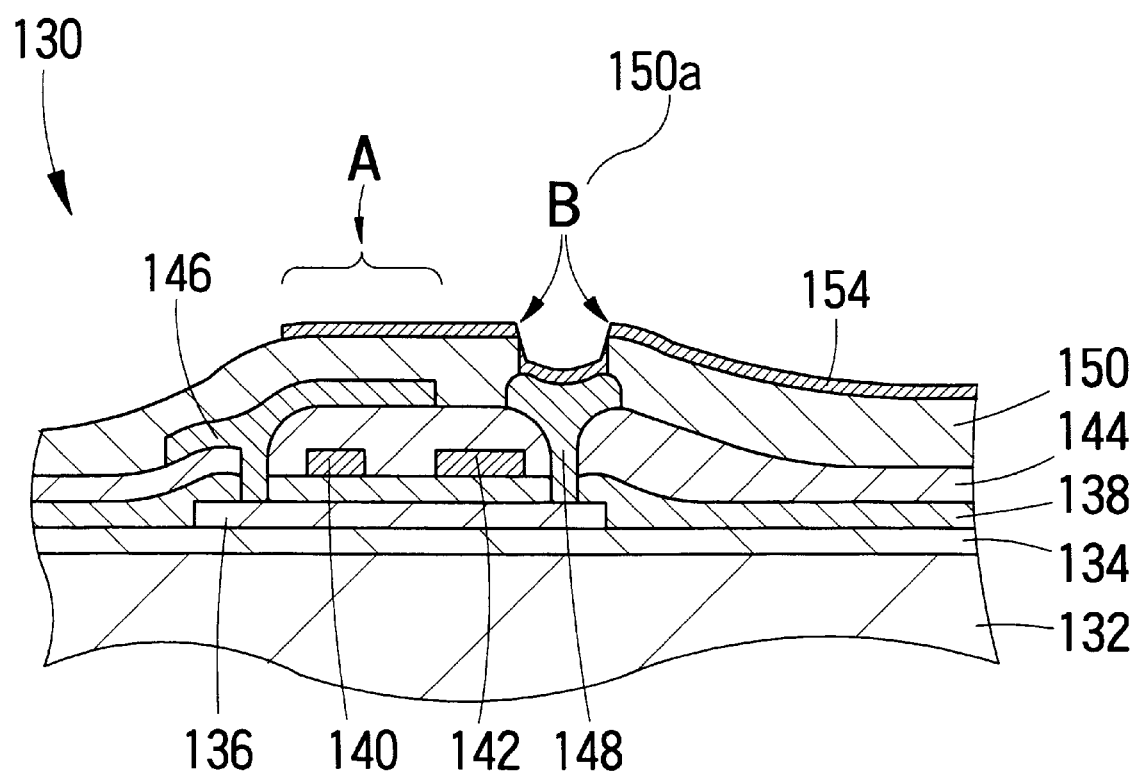
FIG. 12 is a schematic cross-sectional view of an array substrate of a conventional liquid crystal display device.

The shape of the hole made in the second inter-layer insulating film may be selected appropriately from circular, rectangular, polygonal, and other various shapes. For example, FIGS. 11A and 11B are sketches showing a rectangular hole in a plan view and in a cross-sectional view taken along the A—A' line of the plan view.

When the hole is rectangular as shown here, there is an additional advantage that a larger contact area relative to a patterned stripe-shaped poly-silicon film, for example, can be obtained under a limited sizing rule to reduce the resistance at the contact portion.

Although the liquid crystal displays shown in the aforementioned embodiments have the alignment layers, other liquid crystal displays which do not need the alignment layers by employing a polymer dispersion liquid crystal are also within the scope of the invention.

What is claimed is:

1. A method for manufacturing an array substrate, comprising the steps of:

forming a semiconductor layer on a base substrate;

forming a first patterned conductive layer on said semiconductor layer;

stacking an inorganic material on said first patterned conductive layer and said semiconductor layer to form a first inter-layer insulating film;

forming a first hole in said first inter-layer insulating film to extend therethrough to a top surface of said first patterned conductive layer;

stacking an organic material on said first inter-layer insulating film to form a second inter-layer insulating film;

forming a second hole in said second inter-layer insulating film to extend therethrough and through said first hole to the top surface of said first patterned conductive layer so that said first inter-layer insulating film is not exposed on an inner wall surface of the second hole;

annealing said second inter-layer insulating film to thermally contract the organic material forming said second inter-layer insulating film so as to change the shape of said hole while continuously covering said first inter-layer insulating film; and stacking a conductive material on said second inter-layer insulating film to form a second patterned conductive layer connected to said first patterned conductive layer through said second hole.

2. The method for manufacturing an array substrate according to claim 1 wherein said annealing step is executed so that the shape of said second hole is changed into a tapered configuration.

3. The method for manufacturing an array substrate according to claim 2 wherein the shape of said second hole is circular, rectangular or polygonal.

4. The method for manufacturing an array substrate according to claim 2 wherein said annealing step is executed so that the tangential line of the steepest portion of the inner wall surface of said second hole makes an angle not larger than 70 degrees relative to the major surface of said base substrate.

5. The method for manufacturing an array substrate according to claim 1 wherein said annealing step is executed so that said second hole defines a curved plane at an opening end thereof.

6. The method for manufacturing an array substrate according to claim 5 wherein said annealing step is executed so that the radius of curvature of said curved plane be not smaller than $1 \times 10^{-8}$ m and not larger than radium $1 \times 10^{-4}$ m.

7. The method for manufacturing an array substrate according to claim 1 wherein said step of forming the semiconductor layer includes a step of forming a plurality of island-shaped semiconductor layers each forming one of a plurality of switching elements on said base substrate;

said step of forming the first patterned conductive layer includes a step for forming said first patterned conductive layer as an output terminal of each said island-shaped semiconductor layer; said inorganic material mainly containing silicon nitride or silicon oxide; said organic material mainly containing an acrylic resin or polyamide; and said step of forming said second patterned conductive layer includes a step of forming pixel electrodes each connected to each said switching element.

8. The method for manufacturing an array substrate according to claim 1 wherein said step of annealing includes a step of heating the second inter-layer insulating film to a temperature not lower than 90° C. and not higher than 300° C.

9. A method for manufacturing a liquid crystal display device including an array substrate on which a plurality of switching elements and pixel electrodes are formed, an opposite substrate disposed in confrontation with said array substrate, and a liquid crystal layer held between said array substrate and said opposite substrate, comprising the steps of:

forming a semiconductor layer on a base substrate;

forming a first patterned conductive layer on said semiconductor layer;

stacking an inorganic material on said first patterned conductive layer and said semiconductor layer to form a first inter-layer insulating film;

forming a first hole in said first inter-layer insulating film to extend therethrough to a top surface of said first patterned conductive layer;

stacking an organic material on said first inter-layer insulating film to form a second inter-layer insulating film to extend therethrough and through said first hole to the top surface of said first patterned conductive layer so that said first inter-layer insulating film is not exposed on an inner wall surface of the second hole;

annealing said second inter-layer insulating film to thermally contract the organic material forming said second inter-layer insulating film so as to change the shape of said hole while continuously covering said first inter-layer insulating film; and stacking a conductive material on said second inter-layer insulating film to form a second patterned conductive layer connected to said first patterned conductive layer through said second hole.

10. The method for manufacturing a liquid crystal display device according to claim 9 wherein said annealing step is executed so that the shape of said second hole is changed into a tapered configuration.

11. The method for manufacturing a liquid crystal display device according to claim 10 wherein the shape of said second hole is circular, rectangular or polygonal.

12. The method for manufacturing a liquid crystal display device according to claim 10 wherein said annealing step is executed so that the tangential line of the steepest portion of the inner wall surface of said second hole makes an angle not larger than 70 degrees relative to the major surface of said base substrate.

13. The method for manufacturing a liquid crystal display device according to claim 9 wherein said annealing step is executed so that said second hole defines a curved plane at an opening end thereof.

14. The method for manufacturing a liquid crystal display device according to claim 13 wherein said annealing step is executed so that the radius of curvature of said curved plane be not smaller than $1 \times 10^{-8}$ m and not larger than radium $1 \times 10^{-4}$ m.

15. The method of manufacturing a liquid crystal display device according to claim 9 wherein said step of forming the semiconductor layer includes a step of forming a plurality of island-shaped semiconductor layers each forming one of a plurality of switching elements; said step of forming the first patterned conductive layer includes a step for forming said first patterned conductive layer as an output terminal of each said island-shaped semiconductor layer; said inorganic material mainly containing silicon nitride or silicon oxide; said organic material mainly containing an acrylic resin or polyamide; and said step of forming said second patterned conductive layer including a step of forming pixel electrodes for applying a voltage to said liquid crystal layer.

16. The method for manufacturing a liquid crystal display device according to claim 9 wherein said step of annealing includes a step of heating the second inter-layer insulating film to a temperature not lower than 90° C. and not higher than 300° C.

17. The method of manufacturing an array substrate according to claim 1 wherein said annealing step is executed so that said inner wall surface is changed into a gentle slope by extending an opening of an upper part of said second hole by thermally contracting said organic material forming said second inter-layer insulating film.

18. The method for manufacturing a liquid crystal display device according to claim 9 wherein said annealing step is executed so that said inner wall surface is changed into a gentle slope by extending an opening of an upper part of said second hole by thermally contracting said organic material forming said second inter-layer insulating film.

* * * * *